Figures 1A, 1B:
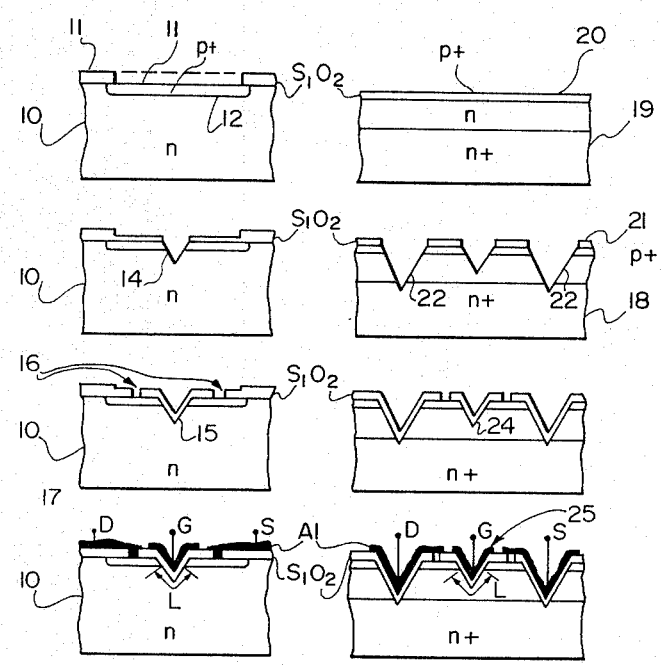

United States Patent [19]

Holmes et al.

[11] 4,003,126

[45] Jan. 18, 1977

[54] METHOD OF MAKING METAL OXIDE SEMICONDUCTOR DEVICES

[75] Inventors: Frank E. Holmes, Willowdale; Clement A. T. Salama, Toronto, both of Canada

[73] Assignee: Canadian Patents and Development Limited, Ottawa, Canada

[22] Filed: Sept. 12, 1974

[21] Appl. No.: 505,369

[52] U.S. Cl. .................. 29/571; 29/580; 357/23; 357/55

[51] Int. Cl.² ........................................ B01J 17/00

[58] Field of Search ............. 29/571, 578, 580; 357/23, 55, 59

[56] References Cited
UNITED STATES PATENTS

| | | | |
|---|---|---|---|
| 3,503,124 | 3/1970 | Wanlass | 29/571 |
| 3,574,010 | 4/1971 | Brown | 29/571 |
| 3,775,191 | 11/1973 | McQuhae | 29/571 |
| 3,806,771 | 4/1974 | Petruzella | 357/55 |
| 3,878,552 | 4/1975 | Rodgers | 357/55 |
| 3,930,300 | 1/1976 | Nicolay | 29/580 |

Primary Examiner—W. Tupman
Attorney, Agent, or Firm—James R. Hughes

[57] ABSTRACT

A MOS transistor fabrication method using either three or four masking steps and wherein the channel between source and drain is defined by preferential etching of the semiconductor material resulting in a relatively deep V-shaped groove formed in the material between source and drain with the channel passing around this V-groove.

2 Claims, 4 Drawing Figures

METHOD OF MAKING METAL OXIDE SEMICONDUCTOR DEVICES

This invention relates to a method of fabrication of semiconductor devices and more particularly to a method of making metal oxide semiconductor field effect transistor devices.

In recent years the trend in metal oxide semiconductor (MOS) digital integrated circuits has been towards producing more complex circuits operating at higher speeds. To produce such circuits with high hields and at low cost, the device-packing density has to be increased while still maintaining, if possible, non-critical dimensional-alignment tolerances. To improve the packing density and speed of operation, short-channel devices are required. In standard MOS devices, a short channel usually entails large parasitic capacitances and MOS transistors that are conventionally processed with short channels exhibit low breakdown voltages. A variety of methods have been used to minimize the parasitic capacitances including ion implantation, silicon gate, and selective oxidation which are self-aligning and reduce overlap between the gate region and the source and drain. These methods result in devices that exhibit low-breakdown voltages and high output conductances which make them unsuitable for many integrated circuit applications. The double diffused MOS (DMOS) transistor provides low parasitic capacitances, high breakdown voltages and low output conductances but requires more complex processing (two critical diffusions instead of one) and is less suitable in integrated circuit applications due to its complex geometry and low packing density. All of these technologies require specialized processing procedures not available with standard MOS production lines.

It is an object of the present invention to provide a method of producing MOS transistors with short channels, small overlap capacitances, high breakdown voltages, and which can result in high packing density digital integrated circuits.

It is another object of the invention to provide a fabrication method for MOS transistor, devices which does not involve the need for critical alignment tolerances.

These and other objects of the invention are achieved by a MOS transistor fabrication method using either three or four masking steps and wherein the channel between source and drain is defined by preferential etching of the semiconductor material resulting in a relatively deep V-shaped groove formed in the material between source and drain with the channel passing around this V-groove.

Figure 2:
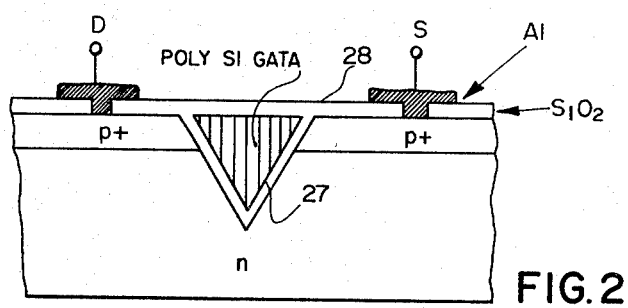
Figure 3:
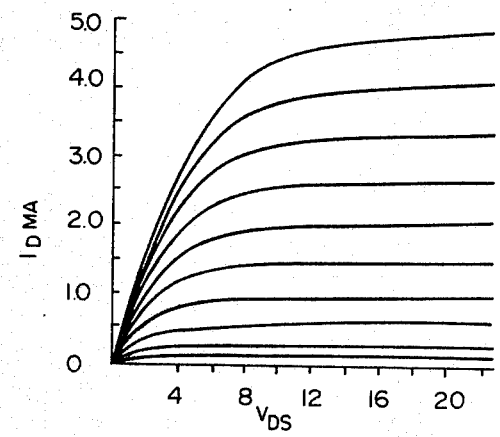

In drawings which illustrate embodiments of the invention,

FIG. 1a is a 4-mask process of making V-groove metal oxide semiconductor (VMOS) transistors, FIG. 1b is a 3-mask process, FIG. 2 is a cross-section of a silicon gate VMOS transistor, and FIG. 3 is a plot of operating characteristics of a typical VMOS device made according to the techniques disclosed herein.

Referring to FIG. 1a the steps for forming an n-type silicon (p-channel) device is shown although the processing steps would apply equally as well to the forming of n-channel devices. The processing begins with a slice of n-type material 10 of (100) orientation. This is required for the preferential etching of a sharp, chisel-shaped groove. A thick thermal oxide (field oxide) $SiO_2$ layer 11 is first grown on the silicon substrate 10. A masked boron diffusion (1st mask) is then performed to form a $p^+$ layer 12 to define the source-drain region. The boron drivein is carried out in an oxidizing ambient atmosphere. A window 13 (2nd mask) is opened in the oxide covering the $p^+$ diffusion and a V-groove channel 14 is formed in the silicon by anisotropically etching to a sufficient depth to separate the source and drain regions. The directional etchant etches into the (100) planes of silicon at a much faster rate than into the (111) planes, resulting in the sharp, chisel-shaped V-groove geometry. Etchant materials that may be used are hydrazine and potassium hydroxide. The V-groove is self-stopping and the wall of the groove slopes down from the horizontal at an angle of approximately 55°.

The gate oxide layer 15 is then formed by thermal growth and is non-uniform due to the particular geometry of the groove with the oxide being thicker near the bottom of the groove than on the walls. It has been found that this feature is responsible for some of the unique and desirable characteristics of the VMOS transistors. Finally, source-drain contact holes 16 are opened in the oxide layer, (3rd mask) and aluminum metal is deposited on the slice and the metallization pattern is defined using the final (4th mask).

As shown is FIG. 1b these devices can be fabricated using a 3-mask technology. Fabrication begins with an $n/n^+$ epitaxial slice 19 of (100) orientation. An unmasked boron diffusion is performed to form the $p^+$ layer 20 with the boron drive-in being carried out in oxidizing ambient atmosphere. The first mask is used to open windows in the oxide 21 covering the $p^+$ diffusion 20 to simultaneously define the channel and the outer edges of the source drain-regions by etching the grooves 22 down to the $n^+$ substrate thus isolating individual devices. The gate oxide layer is then thermally grown and the metallization 25 defined as in the four-mask process.

With both processes, the channel length is determined by the junction depth of the diffusion and the depth of the etched groove (which in turn is controlled by the width of the window opened in the oxide). Both these dimensions can be accurately controlled to permit the fabrication of very short channel devices with reproducible characteristics. Furthermore, the gate overlap capacitance is determined primarily by the area of the diffused regions exposed by the channel etch since the unetched surface of the diffused regions is covered with a thick oxide layer. This permits the use of a relatively wide gate metallization without increasing the overlap capacitance. Since the alignment tolerance is mainly determined by the allowable width of this gate metallization, it is possible to fabricate short-channel devices using non-critical alignment tolerances.

FIG. 2 shows the cross-section of a silicon gate VMOS transistor that may be fabricated using the four mask technology. Instead of depositing aluminum for the gate electrode, the grooves are filled with polycrystalline silicon 27 and lapped. A thick field oxide layer 28 is then deposited, contact holes opened the top metallization evaporated and defined. This design of a silicon gate VMOS transistor results in a self-registered gate and a smooth surface structure with no grooves or oxide steps for the top metallization to cross.

Special features of the technique described here are i. Channel length is determined by the width of the window opened in the oxide, which can be well controlled, resulting in devices with reproducible characteristics.

ii. Standard MOS processing is used, except for the silicon etching which does not require specialized, expensive equipment.

iii. No critical gate alignment is required.

iv. Transistors can be made with one less masking step (3 mask process) than required for standard MOS transistors.

v. The technology provides a high packing density structure.

In experimental work done to test the characteristics of these devices, the slices used were (100) orientation with an n-type region resistivity of 2–5Ωcm. The source-drain diffusion was 1.5μm deep, with a sheet resistance of 150Ψcm². The oxide thickness over the $p^+$ diffusions and over the sloping walls of the grooves were 4000 A and 1000 A, respectively. The silicon etch used to define the grooves consisted of a 100 ml hydrazine/ 50 ml$H_2O$ mixture, heated to 100° C. The aluminum metallization used was approximately 0.7μm thick, and did not exhibit any evidence of microcracking in the grooves. The devices were fabricated using an alignment tolerance of 12μm (which by modern day technology, is noncritical) whith various V groove depths, ranging from 3 to 9μm. All the devices had a channel width of 100μm. The measured threshold voltages ranged from −2.8 to −4V. The effective channel lengths of the devices were estimated to be approximately half of the total length L of the triangular V groove, starting from the source diffusion and ending at the drain diffusion. The reason for this is that the channel starts pinching-off at the bottom of the V groove, owing to the thicker gate oxide present there, and the pinched-off region then extends from that point towards the drain diffusion, causing the effective channel length to be only L/2. For the devices fabricated, the effective channel length ranged from 2μm to 12μm. The output conductance of the v.m.o.s. devices in the saturation region, was also found to be much smaller than that of p-channel devices having the same effective channel length. This, again, was attributed to the pinched-off region extending along one side of the triangular groove. The breakdown voltage of the devices was found to be independent of the effective channel length, and was attributed to gate-modulated drain-to-substrate breakdown, rather than channel punchthrough.

The characteristics of a typical VMOS device, fabricated using the 4-mask process, are shown in FIG. 3. The threshold voltage of this particular device was −3.5V, the effective channel length was 3.0μm, and the maximum measured transconductance was 960μΩ at $V_{DS}$ =25V and $V_{GS}$ =−20V. The gate capacitance was 0.4 pF, and the intrinsic parasitic capacitance associated with the gate overlap was estimated to be less than 0.1 pF, resulting in an estimated maximum cutoff frequency for the device of 0.5GHz. The measured output conductance in the saturation region was 16μΩ at $I_D$ = 1mA.

The VMOS transistor by itself exhibits characteristics which make it useful as an individual element in linear circuits, particularly in high frequency amplification. The technology is also compatible with bipolar V-groove oxide isolation processes, permitting the simultaneous fabrication of NPN bipolar transistors and high-speed p-channel MOS transistors on the same chip. This makes the structure useful for high frequency linear integrated circuit applications. The low output conductance of the VMOS transistor makes it more suitable as a bucket-brigade analog shift register element than a standard transistor; thus permitting the fabrication of longer bucket-brigade arrays with higher operating frequencies. The high packing density of the VMOS technology makes it ideally suited for the fabrication of large scale integrated (LSI) digital circuits. The short channel length and reduced parasitic capacitances will permit the fabrication of LSI circuits with higher operating frequencies.

I claim:

1. A method of making metal oxide semiconductor field effect transistor devices comprising:
   a. forming epitaxially a slice or slab of semiconducting material composed of an $n^+$ substrate layer and an n layer, said material having a (100) crystal orientation normal to the surface of the n layer,
   b. forming by diffusion, a $p^+$ layer in said surface of the n layer,
   c. forming an oxide layer on said $p^+$ layer,
   d. opening a central and two outer windows in the oxide layer,
   e. forming through the central window a central V-groove by anisotrophically etching the semiconducting material along a (100) plane, said groove extending through the $p^+$ layer, separating it into separate regions, and into the n layer and defining a conduction channel between said separated regions around the groove through the n-type material,
   f. forming through the outer windows, outer V-grooves extending through the $p^+$ layer and the n layer into the $n^+$ substrate layer to effectively define the outer edges of the separated regions,
   g. growing a gate oxide layer on the surface of the semiconductor, said layer extending over the surface of the said central V-groove, and
   h. forming metal contacts to the two separate regions defining source and drain electrodes and to the gate oxide layer defining the gate electrode.

2. A method of making metal oxide semiconductor field effect transistor devices comprising:
   a. forming epitaxially a slice or slab of semiconducting material composed of a $p^+$ substrate layer and a p layer, said material having a (100) crystal orientation normal to the surface of the p layer,
   b. forming by diffusion, an $n^+$ layer in said surface of the p layer,
   c. forming an oxide layer on said $n^+$ layer,
   d. opening a central and two outer windows in the oxide layer,
   e. forming through the central window a central V-groove by anisotropically etching the semiconducting material along a (100) plane, said groove extending through the $n^+$ layer, separating it into separate regions, and into the p layer and defining a conduction channel between said separated regions around the groove through the p-type material,
   f. forming through the outer windows, outer V-grooves extending through the $n^+$ layer and the p layer into the $p^+$ substrate layer to effectively define the outer edges of the separated regions,
   g. growing a gate oxide layer on the surface of the semiconductor, said layer extending over the surface of the said central V-groove, and
   h. forming metal contacts to the two separate regions defining source and drain electrodes and to the gate oxide layer defining the gate electrode.

* * * * *